(12) United States Patent
Tchoulfian et al.

(10) Patent No.: US 12,074,191 B2
(45) Date of Patent: Aug. 27, 2024

(54) OPTOELECTRONIC DEVICE WITH LIGHT-EMITTING DIODES A DOPED REGION OF WHICH INCORPORATES AN EXTERNAL SEGMENT BASED ON ALUMINIUM AND GALLIUM NITRIDE

(71) Applicant: ALEDIA, Échirolles (FR)

(72) Inventors: Pierre Tchoulfian, Grenoble (FR); Benoît Amstatt, Grenoble (FR)

(73) Assignee: ALEDIA, Échirolles (FR)

( * ) Notice: Subject to any disclaimer, the term of this patent is extended or adjusted under 35 U.S.C. 154(b) by 453 days.

(21) Appl. No.: 17/613,252

(22) PCT Filed: Apr. 29, 2020

(86) PCT No.: PCT/FR2020/050725
§ 371 (c)(1),
(2) Date: Nov. 22, 2021

(87) PCT Pub. No.: WO2020/234521
PCT Pub. Date: Nov. 26, 2020

(65) Prior Publication Data
US 2022/0223646 A1 Jul. 14, 2022

(30) Foreign Application Priority Data
May 20, 2019 (FR) ...................................... 1905257

(51) Int. Cl.
*H01L 27/15* (2006.01)
(52) U.S. Cl.
CPC .................................. *H01L 27/156* (2013.01)
(58) Field of Classification Search
CPC ..... H01L 27/156; H01L 33/145; H01L 33/24; H01L 33/025; H01L 33/32; H01L 33/16
See application file for complete search history.

(56) References Cited

U.S. PATENT DOCUMENTS 10,424,692 B2 * 9/2019 Amstatt .................. H01L 33/18
10,923,528 B2 * 2/2021 Dupont ................. H01L 33/385
(Continued)

FOREIGN PATENT DOCUMENTS

| FR | 3053530 A1 | 1/2018 |
|---|---|---|
| WO | 2017042512 A1 | 3/2017 |
| WO | 2019002720 A1 | 1/2019 |

OTHER PUBLICATIONS

International Search Report issued Aug. 12, 2020 re: Application No. PCT/FR2020/050725, pp. 1-2.

*Primary Examiner* — Victor A Mandala
(74) *Attorney, Agent, or Firm* — CANTOR COLBURN LLP

(57) ABSTRACT

An optoelectronic device includes a substrate and wire-shaped light-emitting diodes the wire shape of which is elongate along a longitudinal axis. Each light-emitting diode has a doped first region including, over all or some of its height measured along the longitudinal axis, of a central first segment that is substantially elongate along the longitudinal axis, this segment being based on gallium nitride, and of an external second segment, this segment being based on aluminium and gallium nitride. The second segment includes an external first portion arranged laterally around the first segment (121), all or some of the first portion having a first average atomic concentration of aluminium, and of a lower second portion arranged at least between the first portion of the second segment and the substrate, the second portion having a second average atomic concentration of aluminium being electrically insulating.

15 Claims, 2 Drawing Sheets

(56) References Cited

U.S. PATENT DOCUMENTS

| | | | | |
|---|---|---|---|---|
| 2015/0236202 A1* | 8/2015 | Chun | .................. | H01L 33/24 |
| | | | | 257/88 |
| 2016/0197064 A1* | 7/2016 | Bouvier | ................ | H01L 33/24 |
| | | | | 257/13 |
| 2016/0233381 A1* | 8/2016 | Bouvier | ................ | H01L 33/007 |
| 2016/0322536 A1* | 11/2016 | Dornel | ................ | H01L 33/0075 |
| 2018/0233610 A1* | 8/2018 | Robin | ............ | H01L 31/035209 |
| 2018/0254382 A1* | 9/2018 | Dupont | ................ | H01L 27/153 |
| 2018/0261785 A1* | 9/2018 | Ahmed | ................ | H10K 59/35 |
| 2018/0366515 A1* | 12/2018 | Hugon | .................. | H01L 33/28 |
| 2019/0165040 A1* | 5/2019 | Dupont | ................ | H01L 33/62 |
| 2019/0170313 A1* | 6/2019 | Albou | .................. | H01L 33/18 |
| 2019/0319066 A1* | 10/2019 | Tan | ...................... | H01L 33/56 |
| 2019/0348566 A1* | 11/2019 | Pourquier | ............ | H01L 33/007 |
| 2020/0365762 A1* | 11/2020 | Tchoulfian | ............ | H01L 33/24 |
| 2021/0384253 A1* | 12/2021 | Tchoulfian | ............ | H01L 27/156 |
| 2022/0029058 A1* | 1/2022 | Kim | .................... | H01L 33/385 |
| 2022/0231076 A1* | 7/2022 | Dupont | ................ | H01L 33/18 |
| 2022/0278081 A1* | 9/2022 | Chikhaoui | ............ | H01L 27/15 |

\* cited by examiner

OPTOELECTRONIC DEVICE WITH LIGHT-EMITTING DIODES A DOPED REGION OF WHICH INCORPORATES AN EXTERNAL SEGMENT BASED ON ALUMINIUM AND GALLIUM NITRIDE

TECHNICAL FIELD

The present disclosure concerns an optoelectronic device including a substrate having a support face and a plurality of light-emitting diodes, each being wire-like shaped and formed on the support face so as to be elongate along a longitudinal axis substantially transverse to the support face of the substrate, each light-emitting diode comprising a first doped area formed on the support face by semiconductor elements doped according to a first doping type, an active area formed in an active material and a second doped area formed by semiconductor elements doped according to a second doping type opposite to the first doping type.

The disclosure also concerns a method for manufacturing an optoelectronic device including a plurality of light-emitting diodes.

The disclosure will find an application in particular in display screens or image or lighting projection systems.

BACKGROUND

In a known manner, an optoelectronic device with light-emitting diodes makes it possible to perform the conversion of an electrical signal into an electromagnetic radiation.

There are optoelectronic devices, in particular display screens or image projection devices, comprising light-emitting diodes based on semiconductor materials comprising a stack of semiconductor layers or three-dimensional elements mostly including at least one element from group III and one element from group V, called thereafter compound III-V, in particular gallium nitride (GaN), gallium and indium nitride (InGaN) and gallium and aluminum nitride (AlGaN).

It is known that each light-emitting diode comprises an active layer exploiting quantum wells comprised in a P-N junction. The P-N junction comprises a semiconductor portion doped according to a first type of N-type doping and a semiconductor portion doped according to a second type of P-type doping.

One of the difficulties in light-emitting diodes having a three-dimensional architecture of the core-shell type is that under certain conditions of growth of the semiconductor elements constituting the light-emitting diode, such as for example the material of a wire core made of Gallium nitride or GaN, defects at the interface between the light-emitting diode and the substrate and at the side faces of the light-emitting diode could unfortunately appear.

These defects can create current leaks that are detrimental to the performances. In an attempt to limit these risks, it has already been imagined to carry out additional steps to electrically isolate these interfaces. As example, deposition of an insulating material at the lower edge of the light-emitting diodes after the growth of the light-emitting diodes or else by making the light-emitting diode in several growth steps, by interposing cleaning for example between the core and the shell, has already been implemented.

However, these solutions involve non-negligible costs, which are often prohibitive, and likely to create other defects.

Another problem lies in the fact that it is necessary to passivate the side surfaces of the light-emitting diodes in order to avoid their oxidation or to limit current leaks through these same faces. For this purpose, there are passivation techniques that involve additional method steps after the growth of the light-emitting diodes. This is not advantageous because it contributes to the implementation of additional steps, involving an increase in manufacturing costs.

SUMMARY

The present disclosure aims at solving all or part of the problems presented above.

In particular, the aim of the disclosure is to provide an optoelectronic device of the aforementioned type which meets at least one of the following objectives:
  providing an optoelectronic device with the least possible defects,
  providing an optoelectronic device having reduced or zero current leaks at the interface with the substrate,
  providing an optoelectronic device having reduced or zero current leaks at the side surfaces,
  providing an optoelectronic device having side surfaces at least partially passivated.

The disclosure also aims at providing a method for manufacturing an optoelectronic device, the method meeting at least one of the following objectives:
  having a reduced number of steps for passivation of at least part of the side surfaces,
  having a reduced number of steps for limiting the current leaks between the light-emitting diode and the substrate,
  having a number of steps for limiting the current leaks from the side surfaces of the light-emitting diode.

This aim can be achieved by providing an optoelectronic device including a substrate having a support face and a plurality of light-emitting diodes, each being wire-like shaped and formed on the support face so as to be elongate along a longitudinal axis substantially transverse to the support face of the substrate, each light-emitting diode comprising a first doped area formed on the support face by semiconductor elements doped according to a first doping type, an active area formed in an active material and a second doped area formed by semiconductor elements doped according to a second doping type opposite to the first doping type, the first doped area consisting, over all or part of its height counted along the longitudinal axis, of a first central portion substantially elongate along the longitudinal axis formed in a first material based on gallium nitride and a second outer portion formed in a second material based on gallium and aluminum nitride, the second portion consisting of a first outer part arranged laterally around the first portion, all or part of the first part having a first average atomic concentration of aluminum and a second lower part arranged, along the longitudinal axis, at least between the first part of the second portion and the substrate, all or part of the second part having a second average atomic concentration of aluminum different from the first average atomic concentration and adapted so that the second part is electrically insulating.

Some preferred yet non-limiting aspects of the optoelectronic device are as follows.

In an implementation of the optoelectronic device, the ratio between the section of the first part of the second portion, considered in a plane perpendicular to the longitudinal axis and positioned at a distance D with respect to the support face, and the section of the first portion considered in said plane, decreases when the distance D increases.

In an implementation of the optoelectronic device, the first average atomic concentration of aluminum corresponds to point atomic concentrations of aluminum considered at different points in the first part, the point atomic concentrations of aluminum could vary in the plane and according to the distance D.

In an implementation of the optoelectronic device, the first average atomic concentration of aluminum is comprised between 0.5% and 15% and the second average atomic concentration of aluminum is comprised between 20% and 50%.

In an implementation of the optoelectronic device, said second material has the second average atomic concentration at all or part of its interface with the first material.

The disclosure also relates to a method for manufacturing an optoelectronic device including a plurality of light-emitting diodes where each has an elongate wire-like shaped along a longitudinal axis A and comprises a first doped area formed on the support face by semiconductor elements doped according to a first doping type, an active area formed in an active material and a second doped area formed by semiconductor elements doped according to a second doping type opposite to the first doping type, the method comprising the following steps:
- a) providing a substrate having a support face, said longitudinal axis A being intended to be substantially transverse to said support face;
- b) forming, at said support face, a plurality of areas each being suitable for the subsequent formation of at least one of the light-emitting diodes;
- c) forming the first doped area of each light-emitting diode at the corresponding area, step c) being carried out in such a way that at the end of step c), the first doped area consists, over all or part of its height counted along the longitudinal axis, on the one hand of a first central portion substantially elongate along the longitudinal axis formed in a first material based on gallium nitride, and on the other hand of a second outer portion formed in a second material based on gallium and aluminum nitride, the second portion consisting of a first outer part arranged laterally around the first portion, all or part of the first part having a first average atomic concentration of aluminum and of a second lower part arranged, along the longitudinal axis, between at least the first part of the second portion and the substrate, all or part of the second part having a second average atomic concentration of aluminum different from the first average atomic concentration and adapted so that the second part is electrically insulating;
- d) forming the active area of each light-emitting diode;
- e) forming the second doped area of each light-emitting diode.

Some preferred yet non-limiting aspects of the method are as follows:

In an implementation of the method, step c) is carried out by epitaxy using at least partially a first gas containing gallium and a second gas containing aluminum and a third gas containing silane $SiH_4$.

In an implementation of the method, step c) is carried out in an enclosure in which a temperature comprised between 900 and 1100° C. prevails.

In an implementation of the method, the first part of the second portion, and the second part of the second portion are obtained by a first segregation phase during step c).

In an implementation of the method, the first average atomic concentration of aluminum is comprised between 0.5% and 15% and the second average atomic concentration of aluminum is comprised between 20% and 50%.

In an implementation of the method, step c) comprises a second segregation phase so that after the second segregation phase, the ratio between the section of the first part of the second portion, considered in a plane perpendicular to the longitudinal axis and positioned at a distance D from the support face, and the section of the first portion considered in said plane, decreases as the distance D increases.

In an implementation of the method, the first average atomic concentration of aluminum corresponds to point atomic concentrations of aluminum considered at different points in the first part, the point atomic concentrations of aluminum could vary in the plane and according to the distance D.

In an implementation of the method, the first segregation phase and the second segregation phase are carried out at least partially at the same time.

In an implementation of the method, during step c) the second gas containing aluminum is injected at a flow rate comprised between 1000 and 2000 sccm and the third gas containing silane $SiH_4$ is injected with a flow rate comprised between 400 and 800 sccm.

In an implementation of the method, the first segregation phase is carried out such that the second material has the second average atomic concentration at all or part of its interface with the first material.

BRIEF DESCRIPTION OF THE DRAWINGS

Other aspects, aims, advantages and features of the disclosure will appear better on reading the following detailed description of preferred embodiments thereof, provided as a non-limiting example, and made with reference to the appended drawings in which.

DETAILED DESCRIPTION OF THE DRAWINGS

Figure 1:
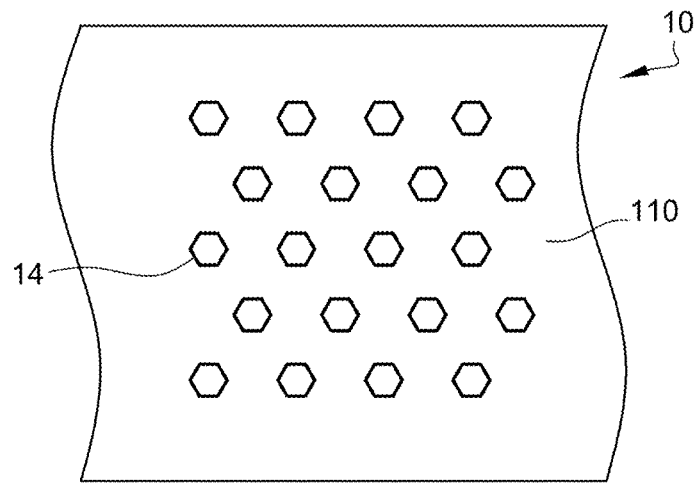
FIG. 1 is a schematic top view representing areas suitable for the growth of light-emitting diode elements on the support face of a substrate.

In the figures and in the following description, the same reference numerals represent identical or similar elements. In addition, the different elements are not represented to scale so as to enhance clarity of the figures. For sake of simplicity, the number of light-emitting diodes represented is limited, but in the embodiments described below there is no limitation as to their number. Moreover, the different embodiments and variants do not exclude one another and may be combined together.

In the text, unless indicated otherwise, the terms «substantially», «about», and «in the range of» mean «within 10%».

The disclosure first covers an optoelectronic device 10 including at least one light-emitting diode 12.

The disclosure also covers a method for manufacturing such an optoelectronic device 10.

Thanks to the optoelectronic device 12 according to the disclosure, a particularly targeted application is the supply of an image display screen or an image projection device.

It is also clear that the disclosure may target other applications, in particular the detection or measurement of electromagnetic radiations or else photovoltaic applications.

The optoelectronic device 10 includes a substrate 11 having a support face 110. The substrate 11 is constituted, for example, by a stack of a monolithic layer (not represented), of a lower electrode layer (not represented) which may be a conductive nucleation layer and of a first electrically insulating layer (not represented). Openings 14 suitable to the growth of first portions 121 and second portions 123 of light-emitting diodes 12 may be formed through one of the aforementioned layers. Those skilled in the art may refer for example to the patent FR3053530 to implement such a substrate 11 and such openings 14.

The support face 110 of the substrate 11 is constituted for example by the free face of said first electrical insulation layer or else by the free face of the lower electrodes.

The monolithic layer may be formed in a doped or non-doped semiconductor material, for example $Al_2O_3$ or silicon or even germanium, and more particularly monocrystalline silicon. It may also be formed in sapphire or even in a III-V semiconductor material, for example GaN. It may alternatively be a substrate of the silicon-on-insulator or "SOI" type. Alternatively, the monolithic layer may be formed in an electrically insulating material.

The nucleation layer makes it possible to initiate the growth of first portions 121 and of second portions 123 of light-emitting diodes. It may be continuous or discontinuous. The material composing the nucleation layer may be a nitride, a carbide or a boride of a transition metal from column IV, V or VI of the Periodic Table of Elements or a combination of these compounds. As example, the nucleation layer may be made of aluminum nitride, aluminum oxide, boron, boron nitride, titanium, titanium nitride, tantalum, tantalum nitride, hafnium, hafnium nitride, niobium, niobium nitride, zirconium, zirconium boride, zirconium nitride, silicon carbide, tantalum nitride and carbide, or magnesium nitride in the $Mg_xN_y$ form, where x is about equal to 3 and y is about equal to 2, for example magnesium nitride in the form $Mg_3N_2$. The nucleation layer may be doped and of the same type of conductivity as that of the semiconductor elements intended to grow, and have a thickness for example comprised between 1 nm and 200 nm, preferably comprised between 10 nm and 50 nm. The nucleation layer may be composed of an alloy or of a stack of at least one material mentioned in the above list. The first electrically insulating layer may comprise a first intermediate insulating layer which covers said lower electrode layer. It forms a growth mask allowing the growth, for example epitaxially, of the first portions 121 and of the second portions 123 of light-emitting diodes 12 from through openings 14 opening locally on the surfaces of the lower electrode layer. The first electrical insulation layer also participates in ensuring electrical insulation between the nucleation layers (not represented) and the second upper electrodes (not represented). The first intermediate insulating layer is made of at least one dielectric material such as, for example, a silicon oxide (for example $SiO_2$ or SiON) or a silicon nitride (for example $Si_3Na$ or SiN), or even a silicon oxynitride, an aluminum oxide (for example $Al_2O_3$) or a hafnium oxide (for example $HfO_2$). The thickness of the first intermediate insulating layer may be comprised between 5 nm and 1 µm, preferably comprised between 20 nm and 500 nm, for example equal to about 100 nm. The first layer of electrically insulating material may further include a second intermediate electrically insulating layer (not represented) which covers the first lower electrodes and participates in ensuring electrical insulation between the first lower electrodes and the second upper electrodes. Said second intermediate electrically insulating layer may also cover the growth mask formed by the first intermediate insulating layer. The second intermediate insulating layer may be made of a dielectric material identical to or different from that of the growth mask, such as, for example, a silicon oxide (for example $SiO_2$) or a silicon nitride (for example $Si_3Na$ or SiN), or even a silicon oxynitride, an aluminum oxide (for example $Al_2O_3$) or a hafnium oxide (for example $HfO_2$). The thickness of the second intermediate insulating layer may be comprised between 5 nm and 1 µm, preferably comprised between 20 nm and 500 nm, for example equal to about 100 nm.

Figure 2:
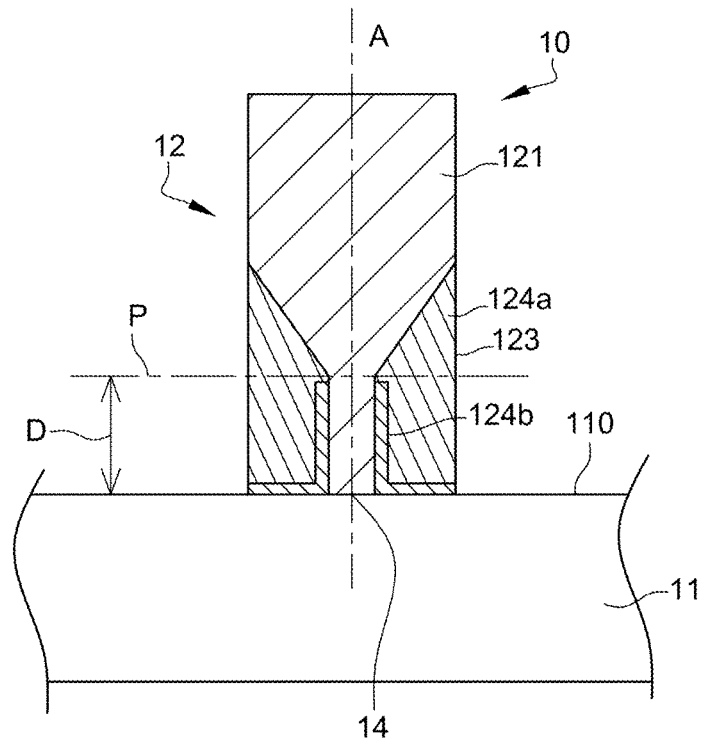
FIG. 2 is a schematic sectional view of a part of a light-emitting diode according to the disclosure.
Figure 3:
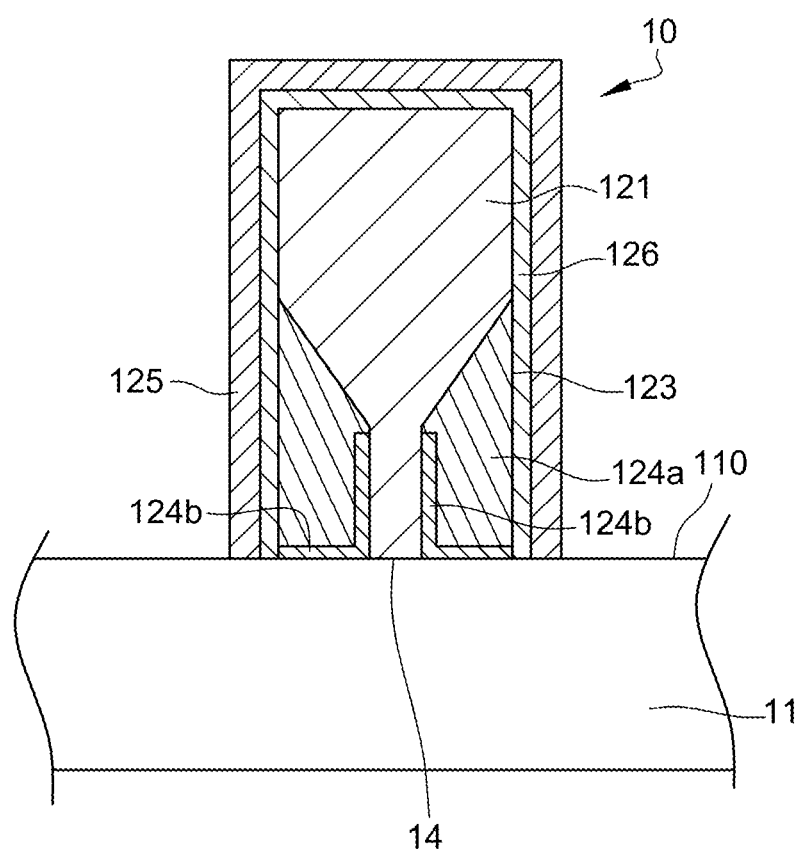
FIG. 3 is a schematic sectional view of a part of a light-emitting diode according to the disclosure.

The light-emitting diodes 12 described in the present disclosure are arranged for example as represented in FIGS. 2 and 3, while being wire-like shaped and formed on the support face 110 so as to be elongate along a longitudinal axis A substantially transverse to the support face 110 of the substrate 11. The light-emitting diodes 12 are preferably three-dimensional, according to micrometric or nanometric dimensions.

Each light-emitting diode 12 comprises a first doped area formed on the support face 110 by semiconductor elements doped according to a first doping type. By "formed on" it should be understood that either the light-emitting diode 12 is formed directly on the support face 110 by means of a contact, or indirectly by providing for the interposition of at least one intermediate layer, such as for example a passivation or nucleation layer or an electrically insulating layer.

The first doped area consists, over all or part of its height counted along the longitudinal axis A, of a first central portion 121 substantially elongate along the longitudinal axis A. The first portion 121 is preferably formed in a first material based on gallium nitride. The first doped area also consists of a second outer portion 123 formed in a second material preferably based on gallium and aluminum nitride. Advantageously, the first material and the second material have similar atomic lattice parameters, which makes it possible to associate them by epitaxy, for example by limiting the stresses.

The second portion 123 consists of a first outer part 124a arranged laterally around the first portion 121. Advantageously, this arrangement makes it possible to limit current leaks because the second material of the second portion 123 has a lower conductivity than that of the first material. All or part of the first part 124a has a first average atomic concentration of aluminum.

In a particular embodiment, the first average atomic concentration of aluminum is comprised between 0.5% and 15% and preferably between 0.5% and 7.5%. The first average atomic concentration of aluminum induces a high electrical resistivity in the second material. Advantageously, this average atomic concentration of aluminum makes it possible to limit current leaks because the second material then has a lower conductivity than that of the first material based on gallium nitride.

The second portion 123 consists of a second lower part 124b arranged, along the longitudinal axis A, between at least the first part 124a of the second portion 123 and the substrate 11. Also the second part 124b may be arranged at the interface between the first part 124a of the second portion 123 and the first portion 121. The second part 124b has a second average atomic concentration of aluminum different from the first average atomic concentration. The second average atomic concentration of aluminum is such that the second material, in this second part 124b, is electrically insulating. In one example, said second portion 123 is advantageously arranged at least partially laterally around the first portion 121 so as to surround at least part of the first portion 121 like a sheath. Said second portion 123 is formed at least partially so as to be in contact with the substrate 11. By "in contact with the support" it should be understood that an interface of the second portion 123 may be the free face of the nucleation layer of the substrate 11 described above or the free face of the first electrically insulating layer of the substrate 11 described above.

In a particular embodiment, the second average atomic concentration of aluminum of the second part 124b is comprised between 20% and 50% and more preferably between 25% and 35%. Advantageously, this second average atomic concentration of aluminum makes it possible to greatly limit current leaks because the second material then has an electrically insulating nature.

In a particular embodiment, said second material has the second average atomic concentration at all or part of its interface with the first material. The second average atomic concentration of aluminum may also be present at the interface between the support face 110 of the substrate 11 and the part of the second material having the first average atomic concentration of aluminum. Advantageously, this configuration makes it possible to limit current leaks between, for example, the first doped area and the second doped area described in more details below. This configuration also makes it possible to dispense with electrical isolation external to the light-emitting diode 12, which is expensive and tedious. By "electrical insulator", it should be understood that the second material, at the location where it has a second average atomic concentration of aluminum, has a high resistivity. Advantageously, this also allows a passivation of the first material of the first portion 121 with respect the outside since the second material at least partially surrounds the first material laterally. This also makes it possible to limit the current leakage and to create a passivation between the first material and the external faces of the light-emitting diode 12.

In a particular embodiment, the ratio between the section of the first part 124a of the second portion 123, considered in a plane P perpendicular to the longitudinal axis A and positioned at a distance D relative to the support face 110, and the section of the first portion 121 considered in said plane P, decreases when D increases. This configuration advantageously makes it possible to favor the presence of the second material where the distance D is small, which is the place most vulnerable to current leaks. In one example, the first average atomic concentration of aluminum corresponds to point atomic concentrations of aluminum considered at different points of the first part 124a. The point atomic concentrations of aluminum may vary in the plane P and according to the distance D, for example by following a concentration gradient. Advantageously, in the parts of the first doped area where the distance D is greater, the second material is not present, which preserves the efficiency of the current flowing from the first doped area to the active area described below.

Light-emitting diode 12 also comprises an active area 126 formed in an active material. The active area 126 is the part from which is emitted most of the radiation supplied by the light-emitting diode 12. It may include means for confining electric charge carriers, such as quantum wells. It is, for example, constituted by an alternation of GaN and InGaN layers. The GaN layers may be doped. Alternatively, the active area 126 consists of a single InGaN layer.

The light-emitting diode 12 further comprises a second doped area 125 formed by semiconductor elements doped according to a second doping type opposite to the first doping type.

Preferably, the semiconductor elements of the light-emitting diodes 12 such as the first portion 121 or the second portion 123 or the second doped area 125 have a substantially wire-like, conical or frustoconical shaped. In the text, the terms "light-emitting diode element" refer to the first portion 121 and/or to the second portion 123 and/or to the second doped area 125 and/or to the active area 126 as well as all of these different areas or portions.

In the following description and in the figures, the embodiments are described for three-dimensional light-emitting diodes 12 of the core-shell type as shown in FIG. 3. The core consists of the first and second portions 121 and 123. The shell is formed by the active area 126 covered with the second doped area 125. However, these embodiments could equally well be implemented for three-dimensional light-emitting diodes 12 having an axial structure where the second portion 123, the first portion 121, the active area 126 and the second doped area 125 are stacked in a direction transverse to the plane of the substrate 11. In other words, according to one embodiment, each light-emitting diode 12 has a core-shell structure in which the first doped area constitutes a wire core, the top part and the side edges of which are at least partially covered by a shell itself comprising the stack of at least one layer forming the active area and at least one layer forming the second doped area. Alternatively in another embodiment not represented, each light-emitting diode 12 has an axial structure where the first doped area 121, the active area 126 and the second doped area 125 are respectively stacked along the longitudinal axis A.

In general, the different elements constituting the light-emitting diodes 12 may be obtained by any technique of a person skilled in the art, such as for example: chemical vapor deposition (CVD), Atomic Layer Deposition (ALD), or Physical Vapor Deposition (PVD) or by epitaxy (for example MBE for Molecular Beam Epitaxy) or Metal Organic Vapor Epitaxy (MOVPE).

The first doped area may be P-doped if the second doped area is N-doped but the first doped area will preferably be N-doped and the second doped area 125 P-doped. The first material may be doped to form a first part of a PN or PIN junction. Advantageously, the first doped area is N-doped.

As example, the light-emitting diode elements 12 may be made, at least partially, of semiconductor materials from the group IV such as silicon or germanium or mostly including a III-V compound, for example III-N compounds. Examples from the group III comprise gallium, indium or aluminum. Examples of III-N compounds are GaN, AlN, InGaN or InAlGaN or AlGaN. Other elements from the group V may also be used, for example, phosphorus, arsenic or antimony. In general, the elements in the III-V compound may be combined with different molar fractions. It should be set out that the light-emitting diode elements 12 may indifferently be formed from semiconductor materials including mostly a II-VI compound. The dopant may be selected, in the case of a III-V compound, from the group comprising a P-type dopant from the group II, for example magnesium, zinc, cadmium or mercury, a P-type dopant from the group IV for example carbon, or a N-type dopant from the group IV, for example silicon, germanium, selenium, sulfur, terbium or tin. Preferably, the first portion 121 is in contact with at least one of the parts making up the substrate 11.

In one example, the first portion 121 and the second portion 123 are obtained at least partially at the same time, preferably by epitaxy using at least a first gas containing gallium (for example TMGa for trimethylgallium) with a flow rate comprised between 500 and 1000 sccm (for standard cubic centimeter per minute), at least a second gas containing aluminum (for example: TMAI for trimethylaluminum) with a flow rate comprised between 800 and 1200 sccm and at least a third gas containing silane $SiH_4$ with a flow rate comprised between 50 and 200 sccm. The temperature used for forming the first portion 121 and the second portion 123 is comprised between 900° C. and 1100° C. and more preferably between 950 and 1050° C.

In one embodiment, the first portion 121 and the second portion 123 are obtained at the same time by a first segregation phase between the first material and the second material. In another embodiment, a second segregation phase makes it possible to obtain a first average atomic concentration of aluminum and a second average atomic concentration of aluminum in the second material. The two segregation phases may preferably take place at the same time. The use of segregation phases to obtain one or more resistive or insulating part(s) of a material is advantageous because this does not require any additional operation.

A third part of the light-emitting diode 12 may be constituted by the second doped area 125. The second doped area 125 may be doped according to a second doping type preferably P. It may be formed directly or indirectly on the free interfaces of the active area 126. Once the second doped area 125 is formed, the light-emitting diode 12 is able to emit light under electrical excitation.

The disclosure also relates to the implementation of a method for manufacturing an optoelectronic device 10 according to the disclosure as described above. The manufacturing method comprises the following steps:
   a) providing a substrate 11 having a support face 110, said longitudinal axis A being intended to be substantially transverse to said support face 110;
   b) forming, at said support face 110, a plurality of areas 14 each being suitable for the subsequent formation of at least one of the light-emitting diodes 12;
   c) forming the first doped area of each light-emitting diode 12 at the corresponding area 14. Step c) is carried out in such a way that at the end of step c), the first doped area consists, over all or part of its height counted along the longitudinal axis A, on the one hand of a first central portion 121 substantially elongate along the longitudinal axis A. The first portion 121 is formed in a first material based on gallium nitride. The first doped area consists on the other hand of a second outer portion 123 formed in a second material based on gallium and aluminum nitride. The second portion 123 consists of a first outer part 124a arranged laterally around the first portion 121. All or part of the first part 124a has a first average atomic concentration of aluminum. The second portion 123 further consists of a second lower part 124b arranged, along the longitudinal axis A, between at least the first part 124a of the second portion 123 and the substrate 11. All or part of the second part 124b has a second average atomic concentration of aluminum different from the first average atomic concentration. As described before, the second average atomic concentration of aluminum is adapted so that the second part 124b is electrically insulating;
   d) forming the active area 126 of each light-emitting diode 12;
   e) forming the second doped area 125 of each light-emitting diode 12.

According to an embodiment of the manufacturing method, step c) is carried out by epitaxy using at least partially a first gas containing gallium and a second gas containing aluminum and a third gas containing silicon such as silane $SiH_4$. The advantage of using silane $SiH_4$ is to promote vertical growth rather than horizontal growth.

According to another embodiment of the manufacturing method, step c) is carried out in an enclosure in which a temperature comprised between 900° C. and 1100° C. and preferably between 950° C. and 1000° C. prevails.

According to another embodiment of the manufacturing method, the first part 124a of the second portion 123, and the second part 124b of the second portion 123 are obtained by a first segregation phase during step c).

According to an embodiment of the manufacturing method, the first average atomic concentration of aluminum is comprised between 0.5% and 15% and preferably between 0.5% and 7.5% and the second average atomic concentration of aluminum is comprised between 20% and 50% and more preferably between 25% and 35%.

According to another embodiment of the manufacturing method, step c) comprises a second segregation phase so that after the second segregation phase, the ratio between the section of the first part 124a of the second portion 123, considered in a plane P perpendicular to the longitudinal axis A and positioned at a distance D relative to the support face 110, and the section of the first portion 121 considered in said plane P, decreases when D increases. This advantageously makes it possible to obtain an insulating material naturally placed between the first portion 121 and the second doped area 125 which avoids costly steps to limit current leaks between these two entities. This also makes it possible to passivate the first portion 121 because the second portion 123 partially surrounds it with respect to the outside. In one example, the first average atomic concentration of aluminum corresponds to atomic concentrations of aluminum which would be measured at different points of the first part 124a and thus called point concentrations. The point atomic concentrations of aluminum can thus vary in the plane P and according to the distance D for example by following an atomic concentration gradient.

According to another embodiment of the manufacturing method, the first segregation phase and the second segregation phase are carried out at least partially at the same time. This advantageously makes it possible to reduce the number of steps for electrically isolating the first doped area and the second doped area against leakage currents.

According to another embodiment of the manufacturing method, during step c), the first gas (for example TMGa) is injected with a flow rate comprised between 200 and 600 sccm, preferably 400 sccm, the second gas containing aluminum is injected with a flow rate comprised between 1000 and 2000 sccm and the third gas silane $SiH_4$ is injected with a flow rate comprised between 400 and 800 sccm, preferably 600 sccm.

According to another embodiment of the manufacturing method, the first segregation phase is carried out such that the second material has the second average atomic concentration at all or part of its interface with the first material. This advantageously allows that, for example, a part of the first portion 121 and the interface between the second portion 123 and the substrate are electrically isolated from the substrate. Thus, this limits leakage currents.

The invention claimed is:

1. An optoelectronic device including a substrate having a support face and a plurality of light-emitting diodes, each being wire-shaped and formed on the support face so as to be elongate along a longitudinal axis substantially transverse to the support face of the substrate, each light-emitting diode comprising a first doped area formed on the support face by semiconductor elements doped according to a first doping type, an active area formed in an active material and a second doped area formed by semiconductor elements doped according to a second doping type opposite to the first doping type, the first doped area being constituted, over all or part of its height counted along the longitudinal axis, of a first central portion substantially elongate along the longitudinal axis formed in a first material based on gallium nitride and a second outer portion formed in a second material based on gallium and aluminum nitride, the second portion being constituted of a first outer part laterally arranged around the first portion, all or part of the first part having a first average atomic concentration of aluminum and of a second lower part arranged, along the longitudinal axis, at least between the first part of the second portion and the substrate, all or part of the second part having a second average atomic concentration of aluminum different from the first average atomic concentration and adapted so that the second part is electrically insulating.

2. The optoelectronic device according to claim 1, wherein the ratio between the section of the first part of the second portion, considered in a plane perpendicular to the longitudinal axis and positioned at a distance relative to the support face, and the section of the first portion considered in said plane, decreases when the distance increases.

3. The optoelectronic device according to claim 2, wherein the first average atomic concentration of aluminum corresponds to point atomic concentrations of aluminum considered at different points of the first part, the point atomic concentrations of aluminum could vary in the plane and according to the distance.

4. The optoelectronic device according to claim 1, wherein the first average atomic concentration of aluminum is comprised between 0.5% and 15% and the second average atomic concentration of aluminum is comprised between 20% and 50%.

5. The optoelectronic device according to any of claim 1, wherein said second material has the second average atomic concentration at all or part of its interface with the first material.

6. A method for manufacturing an optoelectronic device comprising a plurality of light-emitting diodes where each has an elongate wire-shaped along a longitudinal axis and comprises a first doped area formed on the support face by semiconductor elements doped according to a first doping type, an active area formed in an active material and a second doped area formed by semiconductor elements doped according to a second doping type opposite to the first doping type, the method including the following steps:
  a) providing a substrate having a support face, said longitudinal axis being intended to be substantially transverse to said support face;
  b) forming, at said support face, a plurality of areas each being suitable for the subsequent formation of at least one of the light-emitting diodes;
  c) forming the first doped area of each light-emitting diode at the corresponding area, step c) being carried out in such a way that at the end of step c), the first doped area comprises, over all or part of its height counted along the longitudinal axis, on the one hand of a first central portion substantially elongate along the longitudinal axis formed in a first material based on gallium nitride, and on the other hand of a second outer portion formed in a second material based on gallium and aluminum nitride, the second portion comprising a first outer part arranged laterally around the first portion, all or part of the first part having a first average atomic concentration of aluminum and a second lower part arranged, along the longitudinal axis, between at least the first part of the second portion and the substrate, all or part of the second part having a second average atomic concentration of aluminum different from the first average atomic concentration and adapted so that the second part is electrically insulating;
  d) forming the active area of each light-emitting diode; and
  e) forming the second doped area of each light-emitting diode.

7. The manufacturing method according to claim 6, wherein step c) is carried out by epitaxy using at least partially a first gas containing gallium and a second gas containing aluminum and a third gas containing silane $SiH_4$.

8. The manufacturing method according to claim 6, wherein step c) is carried out in an enclosure in which a temperature comprised between 900° C. and 1100° C. prevails.

9. The manufacturing method according to claim 6, wherein the first part of the second portion, and the second part of the second portion are obtained by a first segregation phase during step c).

10. The manufacturing method according to claim 6, wherein the first average atomic concentration of aluminum is comprised between 0.5% and 15% and the second average atomic concentration of aluminum is comprised between 20% and 50%.

11. The manufacturing method according to claim 6, wherein step c) comprises a second segregation phase so that after the second segregation phase, the ratio between the section of the first part of the second portion, considered in a plane perpendicular to the longitudinal axis and positioned at a distance from the support face, and the section of the first portion considered in said plane, decreases when the distance increases.

12. The manufacturing method according to claim 11, wherein the first average atomic concentration of aluminum corresponds to point atomic concentrations of aluminum considered at different points of the first part, the point atomic concentrations of aluminum could vary in the plane and according to the distance.

13. The manufacturing method according to claim 11, wherein the first segregation phase and the second segregation phase are carried out at least partially at the same time.

14. The manufacturing method according to claim 7, wherein during step c) the second gas containing aluminum is injected with a flow rate comprised between 1000 sccm and 2000 sccm and the third gas containing silane $SiH_4$ is injected at a flow rate comprised between 400 sccm and 800 sccm.

15. The manufacturing method according to claim 9, wherein the first segregation phase is carried out such that the second material has the second average atomic concentration at all or part of its interface with the first material.

* * * * *